United States Patent [19]

Davis et al.

[11] Patent Number: 5,399,515
[45] Date of Patent: Mar. 21, 1995

[54] METHOD OF FABRICATING A SILICON CARBIDE VERTICAL MOSFET AND DEVICE

[75] Inventors: Kenneth L. Davis, Tempe; Charles E. Weitzel, Mesa, both of Ariz.

[73] Assignee: Motorola, Inc., Schaumburg, Ill.

[21] Appl. No.: 90,853

[22] Filed: Jul. 12, 1993

[51] Int. Cl.6 ............... H01L 21/265; H01L 21/302; H01L 21/20
[52] U.S. Cl. ......................... 437/40; 437/69; 437/72; 437/100
[58] Field of Search .......... 437/29, 40, 41, 48, 437/51, 52, 100, 913, 69, 72; 148/DIG. 148; 257/330, 332

[56] References Cited

U.S. PATENT DOCUMENTS

| | | | |
|---|---|---|---|
| 4,278,705 | 7/1981 | Agraz-Guerena et al. | 427/93 |
| 4,343,080 | 8/1982 | Hataishi et al. | 437/31 |
| 4,992,838 | 2/1991 | Mori | 257/330 |
| 4,994,413 | 2/1991 | Eshita | 437/100 |
| 5,233,215 | 8/1993 | Baliga | 257/490 |
| 5,242,845 | 9/1993 | Baba et al. | 437/29 |
| 5,248,893 | 9/1993 | Sakamoto | 257/288 |
| 5,270,244 | 12/1993 | Baliga | 437/100 |

OTHER PUBLICATIONS

Silicon Processing for the VLSI Era, S. Wolf and R. Tauber, vol. 1, p. 325 and p. 556 (1986).

*Primary Examiner*—Olik Chaudhuri
*Assistant Examiner*—Brian K. Dutton
*Attorney, Agent, or Firm*—Eugene A. Parsons

[57] ABSTRACT

A silicon carbide LOCOS vertical MOSFET formed on a silicon carbide substrate with portions of epitaxial layers defining the various transistor electrodes, rather than defining the electrodes with implants and diffusion. Because of the low diffusion rate in silicon carbide, the LOCOS operation can be performed after the doped epitaxial layers are formed.

17 Claims, 3 Drawing Sheets

METHOD OF FABRICATING A SILICON CARBIDE VERTICAL MOSFET AND DEVICE

FIELD OF THE INVENTION

The present invention pertains to methods of fabricating MOSFETs and to the devices and more particularly to methods of fabricating silicon carbide vertical MOSFETs utilizing LOCOS procedures and to the devices.

BACKGROUND OF THE INVENTION

There is currently a growing demand for power devices which offer improved operating efficiency and higher speed. Power MOSFETs have inherently higher switching speeds than bipolar transistors and thus are strong candidates for use in high frequency switch mode power supplies and inverters. The fabrication of MOSFETs include many diffusion and wet etch steps to form the various electrodes of the device in a substrate of silicon or the like, which materials are readily susceptible to such process steps.

However, silicon and the like have a relatively low breakdown voltage and poor thermal conductivity, resulting in devices which are rather severely limited in voltage, power, and operating temperature characteristics.

Some attempts have been made to rectify these shortcomings by fabricating lateral MOSFETs from silicon carbide, which is capable of withstanding a much larger breakdown voltage and has a better thermal conductivity. However, lateral MOSFETs have the disadvantage of requiring much larger die area for devices capable of performing at an equivalent level with vertical structures.

It is a purpose of the present invention to provide a relatively easy method of fabricating LOCOS vertical MOSFETs from silicon carbide.

It is a further purpose of the present invention to provide a method of fabricating LOCOS vertical MOSFETs from silicon carbide without requiring difficult diffusion and/or implant steps.

It is a further purpose of the present invention to provide a method of fabricating LOCOS vertical MOSFETs from silicon carbide without requiring difficult wet etch steps.

SUMMARY OF THE INVENTION

The above described problems are substantially solved and the above described purposes are realized in a method of fabricating a silicon carbide LOCOS vertical MOSFET including the steps of providing a silicon carbide substrate of a first conductivity type and forming a first epitaxial layer of the first conductivity type on the surface of the substrate. The epitaxial layer is relatively lightly doped compared to the substrate. Forming a second epitaxial layer of a second conductivity type on the surface of the first epitaxial layer. Forming a relatively thin layer of the first conductivity type adjacent the surface of the second epitaxial layer and forming an opening in the relatively thin layer and a portion of the second epitaxial layer from the surface of the relatively thin layer. Growing a thick local oxidation of silicon (LOCOS) layer in the opening, the thick local oxidation of silicon layer being sufficiently thick to extend through the second epitaxial layer into communication with the first epitaxial layer and defining a gate region. Forming a layer of gate oxide on the relatively thin layer and on the defined gate region and forming a gate contact on the layer of gate oxide in overlying relationship to the gate region. Defining a source region by removing a portion of the layer of gate oxide and forming a source contact on the defined source region.

The above described problems are substantially solved and the above described purposes are further realized in a silicon carbide LOCOS vertical MOSFET including a silicon carbide substrate of a first conductivity type with a first relatively lightly doped silicon carbide epitaxial layer of the first conductivity type positioned on the surface of the substrate and a second silicon carbide epitaxial layer of a second conductivity type positioned on the surface of the first epitaxial layer. A relatively thin layer of the first conductivity type is positioned in overlying relationship on the second epitaxial layer and an opening extends through the relatively thin layer and the second epitaxial layer to define a gate region. A layer of gate oxide is positioned on the relatively thin layer and the surface of the gate region with a gate contact positioned on the layer of gate oxide in overlying relationship to the gate region. The layer of gate oxide has an opening therethrough defining a source region with a source contact positioned on the defined source region.

BRIEF DESCRIPTION OF THE DRAWINGS

Referring to the drawings.

DESCRIPTION OF THE PREFERRED EMBODIMENT

Figure 1:
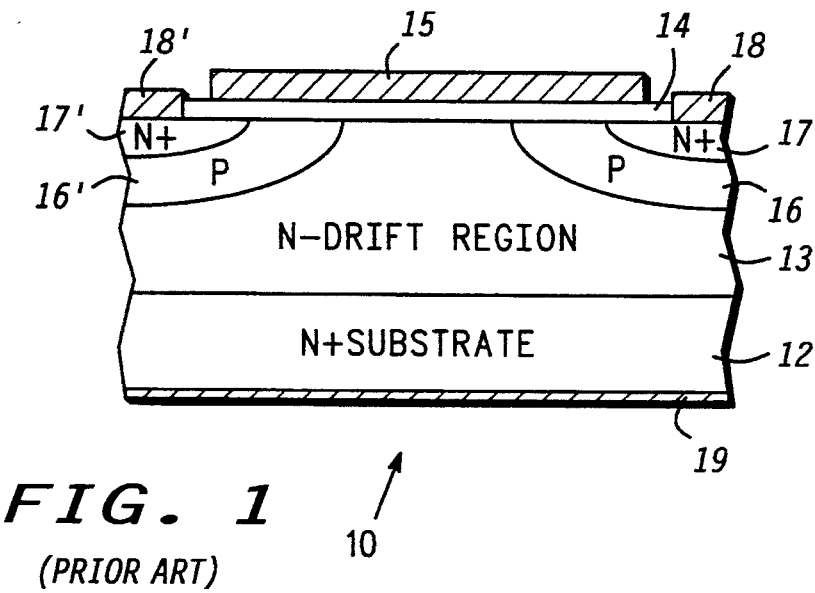
FIGS. 1 and 2 are partial sectional views of prior art DMOSFET and UMOS structures.

Referring specifically to FIG. 1, a partial sectional view of a prior art silicon, power, double diffused metal oxide semiconductor field effect transistor (DMOSFET) 10 is illustrated. Transistor 10 includes an n-type silicon substrate 12 with a lightly doped epitaxial layer 13 grown on the upper surface thereof. A layer 14 of gate oxide is deposited on the surface of epitaxial layer 13 and a refractory gate contact 15 is patterned or selectively deposited on the surface of gate oxide 14. Gate contact 15 serves as an implant or diffusion mask for subsequent steps in the manufacturing process. With gate contact 15 defining the gate and/or channel regions, a first impurity diffusion is performed to form p-type regions 16 and 16'. It will of course be understood by those skilled in the art, that p-type regions 16 and 16' form semi-elliptical tubs and only one half of each tub is illustrated for convenience.

A second impurity diffusion is performed to form n+-regions 17 and 17' within p-type regions 16 and 16'. As is understood in the art, region 17 forms a transistor source, the portion of region 16 adjacent gate 15 forms a channel for the passage of current when proper voltages are applied to transistor 10, and substrate 12 forms the transistor drain. Similarly, region 17' forms a transistor source, the portion of region 16' adjacent gate 15 forms a channel for the passage of current when proper voltages are applied to transistor 10, and substrate 12 forms the transistor drain. Thus, transistor 10, as illustrated in FIG. 1, is really a pair of transistors operating in parallel. Portions of gate oxide layer 14 are removed and refractory source contacts 18 and 18' are deposited in electrical contact with n+-regions 17 and 17', respectively. Also, a metal or refractory drain contact 19 is deposited on the reverse side of substrate 12 to complete transistor 10.

Figure 2:
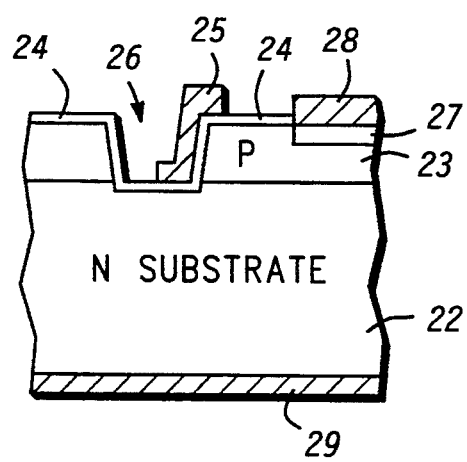

Referring specifically to FIG. 2, a partial sectional view of a prior art UMOS transistor 20 is illustrated. Transistor 20 includes an n-type silicon substrate 22 with a p-type epitaxial layer 23 grown on the surface thereof. Substrate 22 is etched by an anisotropic wet chemical etch to provide an opening 26 with sloped sides. A layer 24 of gate oxide is formed over the surface of the structure, including the bottom and sides of opening 26 and a refractory gate contact 25 is deposited on gate oxide layer 24 along the bottom and sides of opening 26 as well as along a portion of the surface adjacent opening 26. An impurity diffusion is performed to produce an n-type region 27 adjacent the surface of epitaxial layer 23 and spaced from opening 26. A refractory source contact 28 is formed in contact with region 27 and a refractory or metal base contact 29 is formed on the reverse surface of substrate 22. The operation of transistor 20 is basically the same as transistor 10, with gate contact 25 forming a channel in epitaxial layer 23 between region 27 and substrate 22.

Figure 3:
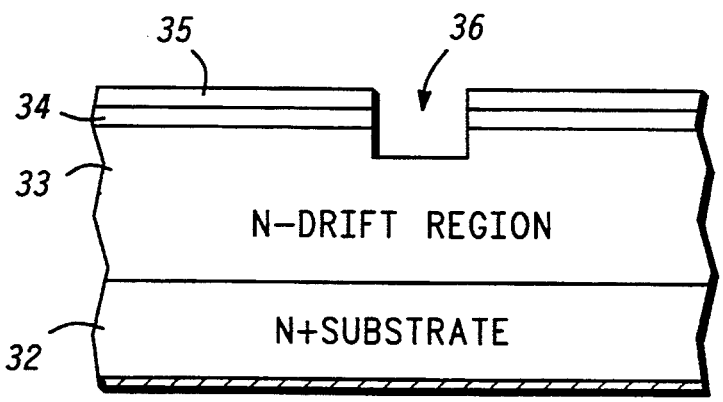
FIGS. 3 and 4 are partial sectional views of prior art LOCOS vertical MOSFETs fabricated in silicon.
Figure 4:
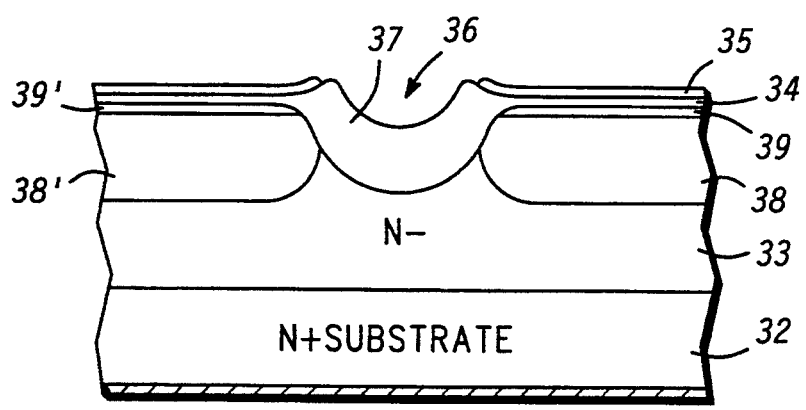

Referring specifically to FIGS. 3 and 4, partial sectional views of two stages in the fabrication in silicon of a prior art LOCOS vertical MOSFET 30 are illustrated. Transistor 30 includes an n-type silicon substrate 32 with a lightly doped epitaxial layer 33 grown on the upper surface thereof. A layer 34 of silicon dioxide is deposited on the surface of epitaxial layer 33 and a protective layer 35 of silicon nitride is patterned or selectively deposited on the surface of silicon dioxide 34 to define an opening 36. Using layers 34 and 35 as a mask, a local oxidation of silicon (LOCOS) 37 is formed in opening 36. LOCOS 37 serves as an implant or diffusion mask for subsequent steps in the manufacturing process. With LOCOS 37 defining the gate and/or channel regions, a first impurity implant and diffusion is performed to form p-type regions 38 and 38'. It will of course be understood by those skilled in the art, that p-type regions 38 and 38' form semi-elliptical tubs and only one half of each tub is illustrated for convenience.

Using LOCOS 37 as a mask, a second impurity implant and diffusion is performed to form n+-regions 39 and 39' within p-type regions 38 and 38'. It will be understood that FIG. 4 of transistor 30 is incomplete and additional well known steps are required to form gate and source regions and contacts. As is understood in the art, region 39 forms a transistor source, a portion of region 38 adjacent LOCOS 37 forms a channel for the passage of current when proper voltages are applied to transistor 30, and substrate 32 forms the transistor drain. Similarly, region 39' forms a transistor source, the portion of region 38' adjacent LOCOS 37 forms a channel for the passage of current when proper voltages are applied to transistor 30, and substrate 32 forms the transistor drain. External electrical contacts to the sources and gate are not illustrated for convenience in illustrating the LOCOS procedure in silicon. Thus, transistor 30, as illustrated in FIG. 4, is really a pair of transistors operating in parallel. Also, a metal or refractory drain contact is deposited on the reverse side of substrate 32 to complete transistor 30.

The properties of silicon carbide (SiC) make it an excellent choice for power FET devices. Silicon carbide has a breakdown field approximately ten times that of silicon, which permits a thinner, heavier doped blocking layer, so that for equivalent reverse breakdown voltage a silicon carbide transistor exhibits more than an order of magnitude lower forward-bias ON-resistance than a silicon transistor of the same geometry. Further, silicon carbide has a thermal conductivity approximately three times that of silicon, which permits silicon carbide to support a significantly higher ON-state current density. Also, silicon carbide has a larger bandgap which permits operation at higher temperatures. Other semiconductor materials, such as diamond, gallium nitride, aluminum nitride, etc. may also have some or all of these properties and may be used in place of silicon carbide in some of the disclosed embodiments.

However, it is impractical to attempt to fabricate transistor 10 of FIG. 1 or transistor 30 of FIG. 4 in silicon carbide because diffusion coefficients in silicon carbide are so low that impurity diffusion is only possible at temperatures exceeding 1800° C. Transistors 10 or 30 are also difficult to fabricate in silicon carbide by using ion implantation instead of diffusion, since in high voltage designs p-type region 16 or 38, respectively, is so thick that an impractically high implant energy would be required.

Transistor 20 of FIG. 2 is difficult to fabricate in silicon carbide because silicon carbide is impervious to most wet etches and plasma etching produces nearly vertical sidewalls. Slightly sloped sidewalls have been produced by $CBrF_3/75\%$ $O_2$ plasma etching with a 6.3:1 vertical:lateral etch rate ratio. However, forming a high quality MOS device on such an etched sidewall is expected to be extremely difficult because of the anticipated defects on the etched silicon carbide sidewall surface.

Figure 5:
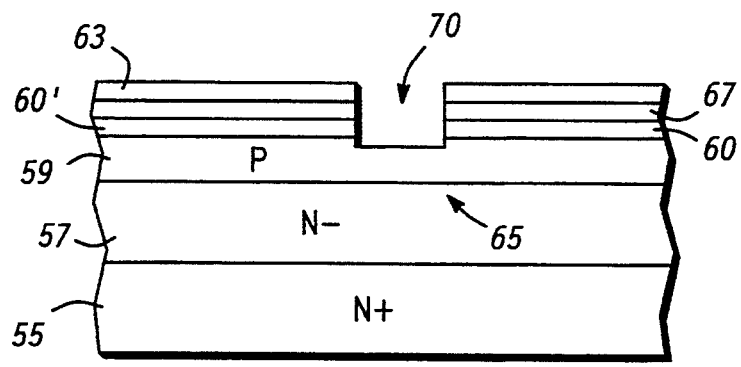
FIGS. 5, 6 and 7 are sequential partial sectional views of various stages in the fabrication of a silicon carbide LOCOS vertical MOSFET constructed in accordance with the present invention.

To overcome the various material, process, and structure disadvantages set forth above, a new and improved method of fabricating a LOCOS vertical MOSFET from silicon carbide is described herein, along with the resulting MOSFET. Referring to FIG. 5, a partial sectional view of an intermediate stage in the fabrication of a transistor 50 is illustrated. Transistor 50 includes a silicon carbide substrate 55 which, in this specific embodiment, is doped with a relatively high level of impurities ($>10^{18}$) to produce n+ conductivity. A first epitaxial layer 57 is formed on the upper surface of substrate 55 and is doped relatively lightly ($\sim 10^{16}$) to produce n− conductivity. A second epitaxial layer 59 is formed on the upper surface of epitaxial layer 57 and is doped to produce p conductivity.

A shallow n+ layer 60 is produced adjacent the upper surface of second epitaxial layer 59. In this specific embodiment, layer 60 is produced by an ion implantation process, which for simplicity is deemed to include annealing and other well known steps utilized to form a relatively uniform layer. It should be understood by those skilled in the art that in a different embodiment layer 60 can be formed as a thin epitaxial layer grown on the surface of second epitaxial layer 59 or by any convenient combinations of epitaxial layers and the ion implant process.

A mask is patterned or otherwise formed on the upper surface of layer 60 to define a gate region 65 and to protect portions of layer 60 during further steps of the fabrication process. In this specific embodiment, the mask is formed of a patterned layer 67 of silicon dioxide and a similarly patterned layer 69 of nitride ($Si_3N_4$). The patterning of layers 67 and 69 can be accomplished by selective deposition or utilizing photosensitive layers and etching in any of the well known methods.

Utilizing layers 67 and 69 as an etch mask, an opening 70 is formed through layer 60 and partially through second epitaxial layer 59. Opening 70 is formed by any convenient means, such as plasma etching or the like and layers 67 and 69 are formed sufficiently thick and of selected material to protect the remaining portion of layer 60 during the etching step. It will be understood by those skilled in the art that opening 70 may be a continuous trench extending into the plane of the paper and separating the left and right portions of transistor 50. Opening 70 extends vertically from the upper surface of layer 60 partially through second epitaxial layer 59, leaving a sufficient amount of layer 59 for subsequent oxidation steps, as will be understood presently.

Figure 6:
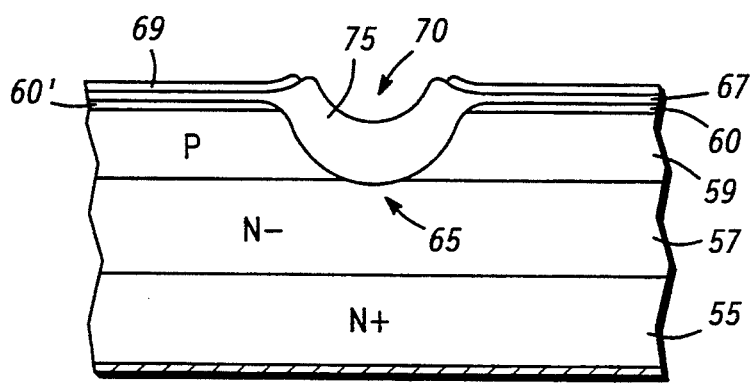

Referring to FIG. 6, a thick LOCOS 75 is grown in opening 70. While the term LOCOS is generally understood to mean the local oxidation of silicon, in the present context it should be understood to include the local oxidation of silicon carbide, which results in the formation of silicon dioxide and vaporous carbon oxides. In silicon carbide the dopants in epitaxial layers 57, 59 and 60 do not diffuse at oxidation temperatures, so the LOCOS step can be performed after the n and p layer formation, unlike in silicon where the processing is not possible in that order. This substantially simplifies the fabrication process. LOCOS 75 forms a smooth, gradual curved surface, which is favorable for gate formation and high breakdown field. The slope and curvature of LOCOS 75 can be controlled by the depth of opening 70 and by oxidation parameters. Silicon carbide oxidizes to form silicon dioxide ($SiO_2$), but the oxidation rates are strongly dependent on temperature and crystal orientation. For example, at 1245° C. the dry oxidation rate on the carbon face of a 6 H crystal is 8 A/min., and on the silicon face it is somewhat slower, at 5 A/min. However, at 1060° C. the rate on the carbon face, 3 A/min., is more than an order of magnitude faster than the rate on the silicon face. For reference, the silicon face dry oxidation rate is approximately 1.5 A/min. at 1300° C. and 0.6 A/min. at 1100° C. These variations in rates for different silicon carbide crystal orientations will affect the curvature of LOCOS 75, and can be used to tailor the curvature as desired.

Figure 7:
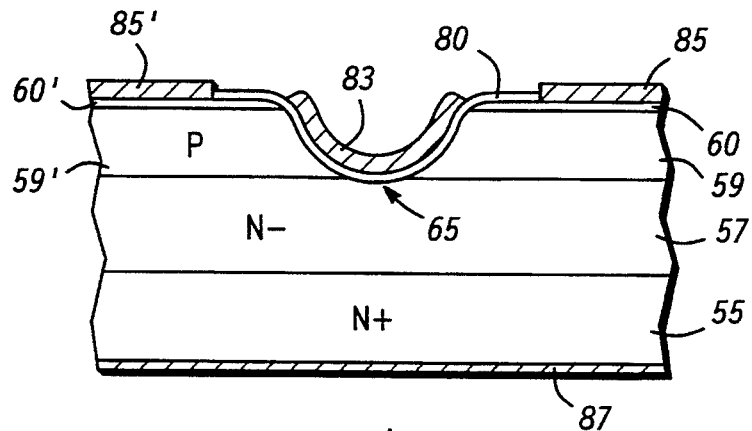

Referring specifically to FIG. 7, the final structure of transistor 50 is illustrated. LOCOS 75 and any remaining portions of layer 67 and layer 69 are stripped by any of the well known processes. Transistor 50 is completed by forming a layer 80 of gate oxide on the upper surface of the structure, as illustrated in FIG. 7. Generally gate oxide is a finer and thinner oxide than the LOCOS, so that all of LOCOS 75 is removed, however, in special circumstances it may be expedient to simply remove layer 69 an a portion of LOCOS 75, leaving a thin layer of oxide as the gate oxide.

A conductive material is deposited on layer 80 in overlying relationship to gate region 65 to form a gate contact 83. Here it will be understood that during operation gate contact 83 forms an inversion current channel in layers 59 and 59' from layers 60 to 57 and from 60' to 57, respectively. A portion of layer 80 is removed adjacent to the left and right sides of opening 70 to expose upper surfaces of layer 60 and 60' which define two source regions. A refractory material is deposited on the exposed upper surfaces of layer 60 to form source contacts 85 and 85'. It will be understood, although it is not shown, that source contacts 85 and 85' also contact layer 59 to short any parasitic transistors formed. Refractory material, or convenient contact metals, are deposited on the rear, or lower, surface of substrate 55 to form a drain contact 87. The portions of layer 80 not actually under gate contact 83 can be increased to a greater thickness by any of several well known processes in order to provide more effective surface passivation.

In transistor 50, the proper application of voltages causes gate contact 83 to produce a current channel in layer 59, 59' from layer 60 to substrate 55 in a manner well known in the art. In the OFF state, the source-drain voltage drops across the p/n junction (primarily depleted layer 57). For proper device operation the p doping level and thickness of layer 59 is carefully chosen so that when transistor 50 is in the OFF state layer 59 will not break down under bias, but will partially deplete so that the high reverse voltage across the p/n junction primarily drops across layer 57.

Thus, a new and improved method of fabricating LOCOS vertical MOSFETs in silicon carbide is disclosed which does not require the use of impurity diffusion or wet chemical etching. Further, the method described fabricates a new and improved LOCOS vertical MOSFET from silicon carbide, which offers the advantages of high breakdown voltages and high current capability in small die area. The novel methods provide a high quality MOS gate region at the smooth surface of the LOCOS region of the device. Further, the device can be manufactured with no diffusion steps. Another advantage of the present invention is that there is a graded curvature (smooth curve) at the bottom of the gate region which reduces or eliminates the electrical potential problems caused by sharp corners.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a silicon carbide local oxidation vertical FET comprising the steps of:

provide a silicon carbide substrate of a first conductivity type with a surface;

forming a first epitaxial layer of the first conductivity type on the surface of the substrate, which said first epitaxial layer is lightly doped compared to the substrate and includes a surface;

forming a second epitaxial layer of a second conductivity type on the surface of the first epitaxial layer;

forming a third layer of the first conductivity type adjacent the surface of the second epitaxial layer, which said third layer is formed thinner than the second epitaxial layer;

forming an opening in the third layer and a portion of the second epitaxial layer from the surface of the third layer;

growing a local oxidation layer in the opening, the local oxidation layer being sufficiently thick to extend through the second epitaxial layer into communication with the first epitaxial layer and defining a gate region;

forming a gate contact in overlying relationship to the gate region;

defining a source region; and forming a source contact on the defined source region in contact with the third layer.

2. A method of fabricating a silicon carbide local oxidation vertical FET as claimed in claim 1 wherein the step of forming a third layer of the first conductivity type includes implanting a dopant into the second epitaxial layer.

3. A method of fabricating a silicon carbide local oxidation vertical FET as claimed in claim 2 wherein the implanting includes ion implanting.

4. A method of fabricating a silicon carbide local oxidation vertical FET as claimed in claim 1 wherein the step of forming a third layer of the first conductivity type includes epitaxially forming the third layer of the first conductivity type on the second epitaxial layer.

5. A method of fabricating a silicon carbide local oxidation vertical FET as claimed in claim 3 wherein the step of forming an opening includes the step of patterning a protective layer capable of withstanding plasma etching on the third layer, the protective layer including an open area, and forming an opening coinciding with the open area by plasma etching.

6. A method of fabricating a silicon carbide local oxidation vertical FET as claimed in claim 5 wherein the step of patterning a protective layer includes forming a silicon oxide layer on the third layer and forming a nitride layer on the layer of silicon oxide.

7. A method of fabricating a silicon carbide local oxidation vertical FET as claimed in claim 1 wherein the step of forming a gate contact includes the steps of forming a layer of gate oxide on the third layer and on the defined gate region and forming a conductive layer in overlying relationship to the gate region.

8. A method of fabricating a silicon carbide local oxidation vertical FET as claimed in claim 7 wherein the step of forming a layer of gate oxide on the third layer and on the defined gate region includes removing some of the local oxidation layer.

9. A method of fabricating a silicon carbide local oxidation vertical FET as claimed in claim 7 wherein the step of forming a layer of gate oxide on the third layer and on the defined gate region includes the steps of removing the local oxidation layer and growing a new gate oxide layer.

10. A method of fabricating a silicon carbide local oxidation vertical FET as claimed in claim 7 including in addition, increasing the thickness of the layer of gate oxide not covered by the gate contact to provide passivation of the FET.

11. A method of fabricating a silicon carbide local oxidation vertical FET as claimed in claim 1 including in addition, forming a drain contact on a second surface of the silicon carbide substrate.

12. A method of fabricating a silicon carbide local oxidation vertical MOSFET comprising the steps of:
providing a silicon carbide substrate of a first conductivity type with a surface;
forming a first epitaxial layer of the first conductivity type on the surface of the substrate, which said first epitaxial layer is lightly doped compared to the substrate and includes a surface;
forming a second epitaxial layer of a second conductivity type on the surface of the first epitaxial layer;
forming a third layer of the first conductivity type adjacent the surface of the second epitaxial layer, which said third layer is formed thinner than the second epitaxial layer;
providing a plasma etch mask on the surface of the third layer for protecting the third layer, the plasma etch mask having an open area defining a gate region;
using the plasma etch mask to etch an opening through the third layer and the second epitaxial layer from the surface of the third layer so as to at least communicate with the first epitaxial layer;
growing a local oxidation layer in the opening, the local oxidation layer being sufficiently thick to extend through the second epitaxial layer into communication with the first epitaxial layer and defining said gate region;
removing at least a portion of the mask;
forming a layer of gate oxide on the third layer and the defined gate region;
forming a gate contact on the layer of gate oxide in overlying relationship to the gate region;
defining a source region adjacent the opening by removing a portion of the layer of gate oxide; and
forming a source contact of metal on the defined source region in contact with the third layer.

13. A method of fabricating a silicon carbide local oxidation vertical MOSFET as claimed in claim 12 wherein the step of forming a third layer of the first conductivity type includes heavily doping the third layer compared to the first epitaxial layer by ion implanting a dopant into the second epitaxial layer.

14. A method of fabricating a silicon carbide local oxidation vertical MOSFET as claimed in claim 12 wherein the step of forming a third layer of the first conductivity type includes epitaxially forming the third layer of the first conductivity type on the second epitaxial layer.

15. A method of fabricating a silicon carbide local oxidation vertical MOSFET as claimed in claim 12 wherein the step of providing a plasma etch mask includes forming a silicon oxide layer on the third layer and forming a nitride layer on the layer of silicon oxide.

16. A method of fabricating a silicon carbide local oxidation vertical MOSFET as claimed in claim 15 wherein the step of removing at least a portion of the plasma etch mask includes removing the nitride layer and the step of forming a layer of gate oxide on the third layer and on the defined gate region includes removing some of the local oxidation of silicon layer.

17. A method of fabricating a silicon carbide local oxidation vertical MOSFET as claimed in claim 12 including in addition, forming a drain contact on a second surface of the silicon carbide substrate.

* * * * *